United States Patent
Trahan et al.

(12) 
(10) Patent No.: US 6,776,826 B1
(45) Date of Patent: Aug. 17, 2004

(54) COMPOSITION AND METHOD FOR ELECTROLESS PLATING OF NON-CONDUCTIVE SUBSTRATES

(75) Inventors: Norman P. Trahan, Lincoln, RI (US); Brian Keough, Cranston, RI (US); Gary Aruda, deceased, late of Portsmouth, RI (US); by Tobias M. Lederberg, Providence, RI (US), Esquire, court-appointed Fiduciary

(73) Assignee: GBN Technologies, Inc., Cranston, RI (US)

( * ) Notice: Subject to any disclaimer, the term of this patent is extended or adjusted under 35 U.S.C. 154(b) by 173 days.

(21) Appl. No.: 09/917,225

(22) Filed: Jul. 27, 2001

(51) Int. Cl.[7] .................. C23C 18/18; C23C 18/32; C23C 18/38; B05D 1/18

(52) U.S. Cl. .............. 106/1.11; 106/1.18; 106/1.22; 106/1.23; 106/1.25; 106/1.26; 427/98; 427/304; 427/305; 427/306; 427/405; 427/372.2; 427/421; 427/437; 427/443.1

(58) Field of Search .................. 106/1.11, 1.18, 106/1.22, 1.23, 1.25, 1.26; 427/98, 304, 305, 306, 405, 372.2, 421, 437, 443.1

(56) References Cited

U.S. PATENT DOCUMENTS

| | | | | |
|---|---|---|---|---|
| 2,995,473 A | * | 8/1961 | Levi | 438/678 |
| 3,817,774 A | | 6/1974 | Kuzmik | 117/47 A |
| 4,136,073 A | * | 1/1979 | Muro et al. | 524/783 |
| 4,457,956 A | * | 7/1984 | Park | 427/203 |
| 4,622,069 A | | 11/1986 | Akai et al. | 106/1.11 |
| 4,663,240 A | | 5/1987 | Hajdu et al. | 428/545 |
| 5,288,313 A | | 2/1994 | Portner | 106/1.11 |
| 5,492,613 A | * | 2/1996 | Zhang et al. | 205/163 |
| 5,624,480 A | * | 4/1997 | Yoshitake et al. | 106/1.22 |
| 5,753,304 A | * | 5/1998 | Tung | 427/304 |
| 5,945,213 A | * | 8/1999 | Nagaike et al. | 428/336 |
| 6,165,561 A | * | 12/2000 | Blum et al. | 427/409 |

\* cited by examiner

Primary Examiner—Helene Klemanski
(74) Attorney, Agent, or Firm—Bromberg & Sunstein LLP

(57) ABSTRACT

Compositions and methods for coating and plating a non-conductive substrate, the substrate having a surface, comprising coating the surface with a binding solution composition, the binding solution composition comprising between approximately 30% by weight and approximately 70% by weight of a binding solution, between approximately 2% by weight and approximately 10% by weight of carbon black powder, between approximately 25% by weight and approximately 50% by weight of aluminum powder, cleaning the coated surface, and immersing the cleaned, coated surface into a plating bath, the plating bath comprising between approximately 5% by volume and approximately 20% by volume hydrofluoric acid, between approximately 4% by volume and approximately 6% by volume copper sulfate, and water.

43 Claims, 1 Drawing Sheet

COMPOSITION AND METHOD FOR ELECTROLESS PLATING OF NON-CONDUCTIVE SUBSTRATES

TECHNICAL FIELD AND BACKGROUND ART

The present invention relates to electroless plating of substrates, and, in particular, to electroless plating of non-conductive substrates.

It is known in the prior art to electroless plate non-conductive substrates of electronic equipment in order to reduce electromagnetic radiation interference and radio frequency interference. In general, the surface of a non-conductive substrate is coated with a catalyst solution and then immersed into an electroless plating solution. The catalyst solution renders the coated surface catalytic to deposition of the plating metal.

In one prior art process, discussed in U.S. Pat. No. 5,288,313, the disclosure of which is incorporated hereby, in its entirety, by reference, the catalyst solution is a film-forming resin containing, among other things, a reduced noble metal salt. For purposes of reference herein, a noble metal is a metal that resists oxidation, such as gold, platinum, and palladium. In another prior art process, discussed in U.S. Pat. No. 4,663,240, the disclosure of which is incorporated hereby, in its entirety, by reference, the catalyst solution is an organic binder containing, among other things, a heavy metal. For purposes of reference herein, a heavy metal is a metal whose specific gravity is greater than 5, such as iron (7.894), cobalt (8.9), nickel (8.9), copper (8.96), silver (10.5), palladium (12.02), gold (19.32), and platinum (21.45).

However, a coating formed with a catalyst solution using a heavy metal is rough in appearance and, as a result, does not adhere well to the surface of the non-conductive substrate. In addition, a catalyst using a heavy metal has substantial precipitation, in other words, the heavy metal separates or "settles out" of the solution. Moreover, heavy metals are a cause of environmental pollution and, thereby, require special handling procedures.

SUMMARY OF THE INVENTION

In accordance with one aspect of the invention, a composition for coating a surface of a non-conductive substrate, the coated surface to be plated with a metal, the composition comprises between approximately 30% by weight and approximately 70% by weight of a binding solution, between approximately 2% by weight and approximately 10% by weight of carbon black powder, and between approximately 25% by weight and approximately 50% by weight of aluminum powder.

In an alternate embodiment of this aspect of the invention, a composition for coating a surface of a non-conductive substrate, the coated surface to be plated with a metal, the composition comprises approximately 50% by weight of a water-born binding solution, approximately 5% by weight of carbon black powder, approximately 25% by weight of aluminum powder, and water.

In alternate embodiments of these inventions, the binding solution may be a solvent-born binding solution, such as a lacquer resin, a vinyl resin, or an enamel resin, or it may be a water-born binding solution, such as a latex resin or an enamel resin. In still other alternate embodiments of these inventions, the binding solution may be clear in color, the carbon black powder may be a carbon black powder with a particle size of between approximately 1 micron and approximately 2 microns, the aluminum powder may be at least 99.0% pure aluminum powder, and the aluminum powder may be an aluminum powder with a particle size of between approximately 2 microns and approximately 3 microns.

In a further embodiment of these inventions, the coating composition may include a reducing agent for the binding solution. In a still further embodiment of these inventions, the coating composition is allowed to stand at least 2 hours prior to use.

In accordance with another aspect of the invention, a composition for plating a surface of a non-conductive substrate, the surface coated with a coating composition, the composition comprises between approximately 5% by volume and approximately 20% by volume hydrofluoric acid, between approximately 4% by volume and approximately 6% by volume plating metal, and water. In an alternate embodiment of the invention, the composition comprises between approximately 5% by volume and approximately 20% by volume phosphoric acid, between approximately 4% by volume and approximately 6% by volume plating metal, and water. The plating metal may be copper, nickel, or gold.

In accordance with still another aspect of the invention, a process for plating a surface of a non-conductive substrate with a metal, the process comprises coating the surface with a binding solution composition, the binding solution composition comprising between approximately 30% by weight and approximately 70% by weight of a binding solution, between approximately 2% by weight and approximately 10% by weight of carbon black powder, between approximately 25% by weight and approximately 50% by weight of aluminum powder, cleaning the coated surface, and immersing the cleaned, coated surface into a plating bath, the plating bath comprising between approximately 5% by volume and approximately 20% by volume hydrofluoric acid, between approximately 4% by volume and approximately 6% by volume copper sulfate, and water.

In an alternate embodiment of this aspect of the invention, a process for plating a surface of a non-conductive substrate with a metal, the process comprises coating the surface with a binding solution composition, the binding solution composition comprising approximately 50% by weight of a water-born binding solution, approximately 5% by weight of carbon black powder, approximately 25% by weight of aluminum powder, and water, cleaning the coated surface, and immersing the cleaned, coated surface into a plating bath, the plating bath comprising between approximately 5% by volume and approximately 20% by volume hydrofluoric acid, between approximately 4% by volume and approximately 6% by volume copper sulfate, and water.

In a further embodiment of these inventions, prior to the process of coating a surface of the non-conductive substrate, the surface of the non-conductive substrate may be pre-cleaned. In a still further embodiment of these inventions, the plated surface may be rinsed with water subsequent to the plating process.

In alternate embodiments of these inventions, the surface of the non-conductive substrate may be coated with the binding solution composition using a spray gun, the coated surface may be plated with the plating metal to a thickness of approximately 80 micro-inches single-sided, or the coat surface may be plated with the plating metal to a thickness of approximately 40 micro-inches double-sided. In further alternate embodiments of these inventions, the coated surface may be cleaned with a cleaner having a pH between approximately 6 and approximately 7, or the coated surface may be cleaned with an ultrasound cleaner.

In accordance with yet another aspect of the invention, a process for selectively plating a non-conductive substrate with a metal, the non-conductive substrate having been masked, the process comprises coating the surface with a binding solution composition, the binding solution composition comprising between approximately 30% by weight and approximately 70% by weight of a binding solution, between approximately 2% by weight and approximately 10% by weight of carbon black powder, between approximately 25% by weight and approximately 50% by weight of aluminum powder, cleaning the non-conductive substrate, and immersing the cleaned, non-conductive substrate into a plating bath, the plating bath comprising between approximately 5% by volume and approximately 20% by volume hydrofluoric acid, between approximately 4% by volume and approximately 6% by volume copper sulfate, and water.

BRIEF DESCRIPTION OF THE DRAWINGS

The foregoing features of the invention will be more readily understood by reference to the following detailed description, taken with reference to the accompanying drawings, in which.

DETAILED DESCRIPTION OF SPECIFIC EMBODIMENTS

Figure 1:
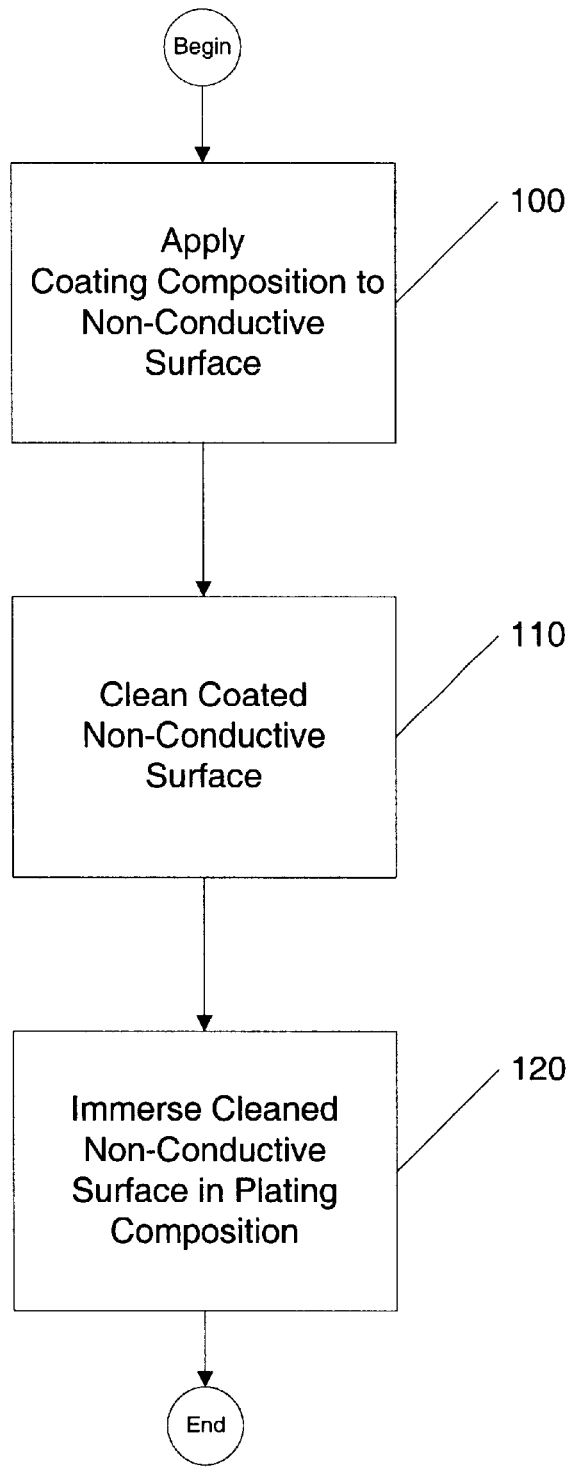
FIG. 1 is a flowchart of an exemplary process for coating and plating a surface of a non-conductive substrate in accordance with the claimed invention.

In accordance with an embodiment of the invention, a coating composition comprises a binding solution, carbon black powder, and aluminum powder. The coating composition is used to coat one or more surfaces of a non-conductive substrate, such as plastic, glass, paper, wood, etc. Typically, the non-conductive substrate will house electronic components that, in operation, emit electromagnetic radiation interference or radio frequency interference. In general, the coating composition is used as part of an electroless plating process, in which the coating composition creates an electro-chemical reaction, also referred to as an ion exchange, when immersed in a plating bath, thereby plating, or selectively plating, the non-conductive substrate. In turn, the plated, or selectively plated, non-conductive substrate attenuates the electromagnetic radiation interference or radio frequency interference emitted from the electronic components that may be housed in the selectively plated non-conductive substrate.

Typically, the binding solution is a solvent-born or water-born "paint." For purposes of reference herein, the term "paint" refers to a mixture of a binding medium thinned with a solvent, sometime referred to as a reducing agent, to form a liquid vehicle, with or without the addition of a pigment. For example, the binding solution may be a lacquer resin, a vinyl resin, a latex resin, or an enamel resin. Typically the phrases "lacquer resin" and "vinyl resin" refer to solvent-born paints. In contrast, the phrase "latex resin" typically refers to a water-born resin. The phrase "enamel resin" may refer to a solvent-born resin or a water-born resin.

In general, carbon black powder and aluminum powder are odorless powders that are commercially-produced with different particle sizes and purity percentages. In regard to the invention claimed and disclosed herein, the carbon powder should contain at least 97% elemental carbon and the aluminum powder should be at least 99% pure aluminum. The particle size of the carbon black powder and the aluminum powder may vary, but should have particle sizes less than approximately 4 microns.

In preparing the coating composition, the carbon black powder is mixed into the binding solution and, upon disbursement, the aluminum powder is mixed into the now carbon-containing binding solution. The carbon black powder and the aluminum powder should be substantially fully disbursed in the binding solution, in other words, the coating composition should be substantially homogeneous. At any point in the mixing process, a reducing agent may be added to "thin" the binding solution.

The coating composition is then applied to one or more surfaces of a non-conductive substrate, using an appropriate application method. For example, the coating composition may be applied using a brush, a hand-held spray gun, or an industrial sprayer. The coating composition may also be applied in layers, with some time for drying between application of each layer. In addition, prior to application of the coating composition, portions of the non-conductive substrate may be "masked" to prevent the deposition of the coating composition on those portions of the non-conductive substrate.

In an alternate embodiment of the invention, the coating composition is let to stand at least 2 hours before the coating composition is applied to one or more surfaces of the non-conductive substrate.

The coating composition is then dried or "cured" using an appropriate curing method. For example, the coating composition may be air-dried, oven-dried, or a combination of air-dried and oven-dried. For example, the coating composition may be allowed to air-dry for approximately 16 hours at a temperature of approximately 65° F. or higher. Or, the coating composition may be oven-dried for approximately 30 minutes at a temperature of approximately 150° F., then cooled for 45 minutes at a temperature of approximately 65° F. or higher.

The amounts of binding solution, carbon black powder, and aluminum powder in the coating composition may range from between approximately 30% by weight to approximately 70% by weight of binding solution, from between approximately 2% by weight to approximately 10% by weight of carbon black powder, and from between approximately 25% by weight to approximately 50% by weight of aluminum powder.

In accordance with another embodiment of the invention, a plating composition comprises hydrofluoric acid, a plating metal, and water. The plating composition reacts, in an electro-chemical reaction, with a coating composition (such as a coating composition made in accordance with the invention claimed and disclosed herein or with a coating composition made in accordance with the prior art) applied to a non-conductive substrate, thereby plating, or selectively plating, the non-conductive substrate with the plating metal. In turn, the plated, or selectively plated, non-conductive substrate attenuates the electromagnetic radiation interference or radio frequency interference emitted from the electronic components that may be housed in the plated, or selectively plated, non-conductive substrate. The plating metal may be any metal used in electroless plating, such as copper, nickel, or gold. In an alternative embodiment, the plating composition comprises phosphoric acid, rather than hydrofluoric acid, a plating metal, and water.

The amounts of hydrofluoric acid (or phosphoric acid) and plating metal in the plating composition may range from between approximately 5% by volume to approximately 10% volume of acid and from between approximately 4% by volume to approximately 6% by volume of plating metal. For the acids, these volume percentages are the volume percentages in the final plating composition although, typically, the acids are purchased, for safety reasons, as reagents, such as 25% or 35% reagents, which are then further reduced to the appropriate concentrations.

EXAMPLES

The following coating compositions were made using Sherwin Williams® Polane® 700T Clear Enamel as the binding solution and water as the reducing agent:

| Example | % Binding Solution | % Carbon Black Powder | % Aluminum Powder | % Reducing Agent |
|---|---|---|---|---|
| 1 | 44.9 | 3.9 | 32.0 | 19.2 |
| 2 | 36.1 | 2.8 | 41.7 | 19.4 |
| 3 | 41.7 | 2.8 | 41.7 | 13.8 |
| 4 | 33.3 | 2.8 | 41.7 | 22.2 |
| 5 | 49.0 | 2.0 | 32.7 | 16.3 |
| 6 | 65.7 | 3.3 | 31.0 | 0.0 |
| 7 | 58.9 | 3.7 | 30.8 | 6.6 |
| 8 | 36.2 | 3.4 | 48.3 | 12.1 |
| 9 | 46.8 | 4.1 | 37.4 | 11.7 |
| 10 | 51.0 | 4.5 | 31.8 | 12.7 |
| 11 | 48.8 | 8.5 | 30.5 | 12.2 |

The following coating compositions were made using a pre-reduced vinyl resin as the binding solution:

| Example | % Binding Solution | % Carbon Black Powder | % Aluminum Powder | % Reducing Agent |
|---|---|---|---|---|
| 12 | 44.5 | 2.5 | 33 | 20 |
| 13 | 49.0 | 2.0 | 39 | 10 |

The following coating compositions were made using a nitrocellulose lacquer as the binding solution and lacquer thinner as the reducing agent:

| Example | % Binding Solution | % Carbon Black Powder | % Aluminum Powder | % Reducing Agent |
|---|---|---|---|---|
| 12 | 44.5 | 2.5 | 33 | 20 |
| 13 | 49.0 | 2.0 | 39 | 10 |

The following plating compositions were made using copper sulfate crystals:

| Example | % Hydrofluoric Acid | % Water | Plating Metal |
|---|---|---|---|
| 1 | 5.0 | 95.0 | .25 pounds/gallon |
| 2 | 9.0 | 91.0 | .25 pounds/gallon |
| 3 | 12.0 | 88.0 | .25 pounds/gallon |
| 4 | 15.0 | 85.0 | .25 pounds/gallon |

The following plating compositions were made using copper sulfate liquid:

| Example | % Hydrofluoric Acid | % Water | Plating Metal |
|---|---|---|---|
| 1 | 5.0 | 95.0 | 1 quart/gallon |
| 2 | 9.0 | 91.0 | 1 quart/gallon |
| 3 | 12.0 | 88.0 | 1 quart/gallon |
| 4 | 15.0 | 85.0 | 1 quart/gallon |

In accordance with still another embodiment of the invention, one or more surfaces of a non-conductive substrate is first coated, in whole or in part, with a coating composition that, in connection with a plating bath, provides an electro-chemical reaction between the coating composition and a plating metal in the plating bath. The coating composition may be made in accordance with the invention claimed and disclosed herein, or it may be made in accordance with the prior art. Then, the coated surface is immersed in a plating bath and plated with a plating metal in the plating bath that attenuates the electromagnetic radiation interference or radio frequency interference emitted from the electronic components that may be housed in the plated, or selectively plated, non-conductive substrate. The plating bath may be made in accordance with the invention claimed and disclosed herein, or it may be made in accordance with the prior art.

FIG. 1 shows an exemplary process for coating and plating one or more surfaces of a non-conductive substrate in accordance with the claimed invention. The process begins at step 100, in which a coating composition is applied, in whole or in part, to one or more surfaces of a non-conductive substrate. The coating composition may be applied using any appropriate method, such as a brush, a hand-held spray gun, or an industrial sprayer. While the coating composition may be applied for any thickness, for most industrial applications, the coating composition is applied such that, when dry, the coating composition does not exceed between approximately 0.002 inches, referred to as 2 mils, and approximately 0.005 inches, referred to as 5 mils.

The process continues at step 110, in which the dried or "cured" coated surface is cleaned. As discussed above, the coating composition may be air-dried or oven-dried. The dried, coated surface may be cleaned using one of several methods. For example, the dried, coated surface may be cleaned with a cleaner having a pH between approximately 6 and approximately 7. Or, the dried, coated surface may be cleaned using an ultrasound cleaner. Regardless of which type of cleaning process is used, the cleaning process needs to, at least partially, open the pores of the coating composition.

The process concludes at step 120, in which the cleaned, coated surface is immersed into a plating bath. The amount of time needed for the plating process to be complete varies in accordance with the coating composition and the desired amount of thickness for the plating metal. For most industrial applications, the coated surface is plated with the plating metal to a thickness of approximately 40 micro-inches double-sided, or 80 micro-inches single-sided.

In a further embodiment of the invention, the non-conductive substrate may be pre-cleaned, prior to application of the coating composition, in order to remove dirt, oils, waxes, etc. from one or more of the substrate's surfaces. In a still further embodiment of the invention, the plated, coated surface may be rinsed with water subsequent to the plating process and then air-dried, for example, for approximately 15 minutes in a temperature of approximately 65° F. or higher.

Although various embodiments of the invention have been disclosed, it should be apparent to those skilled in the art that various changes and modifications can be made which will achieve some of the advantages of the invention without departing from the true scope of the invention. These and other obvious modifications are intended to be covered by the appending claims.

What is claimed is:

1. A composition for coating a surface of a non-conductive substrate, the coated surface to be plated with a metal, the composition comprising:
   a. between approximately 30% by weight and approximately 70% by weight of a binding solution;
   b. between approximately 2% by weight and approximately 10% by weight of carbon black powder; and
   c. between approximately 25% by weight and approximately 50% by weight of aluminum powder.

2. The composition of claim 1, further comprising:
   a. a reducing agent for the binding solution.

3. The composition of claim 1 wherein the binding solution is a solvent-born binding solution.

4. The composition of claim 3 wherein the solvent-born binding solution is S, wherein S is a lacquer resin, a vinyl resin, or an enamel resin.

5. The composition of claim 1 wherein the binding solution is a water-born binding solution.

6. The composition of claim 5 wherein the water-born binding solution is W, wherein W is a latex resin or an enamel resin.

7. The composition of claim 1 wherein the binding solution is clear in color.

8. The composition of claim 1 wherein the carbon black powder is a carbon black powder with a particle size of between approximately 1 micron and approximately 2 microns.

9. The composition of claim 1 wherein the aluminum powder is at least 99.0% pure aluminum powder.

10. The composition of claim 1 wherein the aluminum powder is an aluminum powder with a particle size of between approximately 2 microns and approximately 3 microns.

11. The composition of claim 1 wherein the composition is allowed to stand at least 2 hours prior to use.

12. A composition for coating a surface of a non-conductive substrate, the coated surface to be plated with a metal, the composition comprising:
   a. approximately 50% by weight of a water-born binding solution;
   b. approximately 5% by weight of carbon black powder;
   c. approximately 25% by weight of aluminum powder; and
   d. water.

13. A composition for plating a surface of a non-conductive substrate, the surface coated with a coating composition, the composition comprising:
   a. between approximately 5% by volume and approximately 20% by volume hydrofluoric acid;
   b. plating metal; and
   c. water.

14. The composition of claim 13 wherein the plating metal is P, wherein P is copper, nickel, or gold.

15. A composition for plating a surface of a non-conductive substrate, the surface coated with a coating composition, the composition comprising:
   a. between approximately 5% by volume and approximately 20% by volume phosphoric acid;
   b. plating metal; and
   c. water.

16. The composition of claim 15 wherein the plating metal is P, wherein P is copper, nickel, or gold.

17. A process for plating a surface of a non-conductive substrate with a metal, the process comprising:
   a. coating the surface with a binding solution composition, the binding solution composition comprising between approximately 30% by weight and approximately 70% by weight of a binding solution, between approximately 2% by weight and approximately 10% by weight of carbon black powder, between approximately 25% by weight and approximately 50% by weight of aluminum powder;
   b. cleaning the coated surface; and
   c. immersing the cleaned, coated surface into a plating bath, the plating bath comprising between approximately 5% by volume and approximately 20% by volume hydrofluoric acid, between approximately 4% by volume and approximately 6% by volume copper sulfate, and water.

18. The process of claim 17 wherein prior to the process of coating the surface, further comprising:
   a. pre-cleaning the surface of the non-conductive substrate.

19. The process of claim 17, further comprising:
   a. rinsing the plated surface with water.

20. The process of claim 17 wherein the surface is coated with the binding solution composition using a spray gun.

21. The process of claim 17 wherein the coated surface is plated with the plating metal to a thickness of approximately 80 micro-inches single-sided.

22. The process of claim 17 wherein the coated surface is plated with the plating metal to a thickness of approximately 40 micro-inches double-sided.

23. The process of claim 17 wherein the coated surface is cleaned with a cleaner having a pH between approximately 6 and approximately 7.

24. The process of claim 17 wherein the coated surface is cleaned with an ultrasound cleaner.

25. The process of claim 17 wherein the binding solution is a solvent-born binding solution.

26. The process of claim 25 wherein the solvent-born binding solution is S, wherein S is a lacquer resin, a vinyl resin, or an enamel resin.

27. The process of claim 17 wherein the binding solution is a water-born binding solution.

28. The process of claim 27 wherein the water-born binding solution is W, wherein W is a latex resin or an enamel resin.

29. The process of claim 17 wherein the carbon black powder is a carbon black powder with a particle size of between approximately 1 micron and approximately 2 microns.

30. The process of claim 17 wherein the aluminum powder is at least 99.0% pure aluminum powder.

31. The process of claim 17 wherein the aluminum powder is an aluminum powder with a particle size of between approximately 2 microns and approximately 3 microns.

32. A process for selectively plating a surface of a non-conductive substrate with a metal, the non-conductive substrate having been masked, the process comprising:
   a. coating the surface with a binding solution composition, the binding solution composition comprising between approximately 30% by weight and approximately 70% by weight of a binding solution, between approximately 2% by weight and approximately 10% by weight of carbon black powder, between approximately 25% by weight and approximately 50% by weight of aluminum powder;

b. cleaning the coated surface; and c. immersing the cleaned, coated surface into a plating bath, the plating bath comprising between approximately 5% by volume and approximately 20% by volume hydrofluoric acid, between approximately 4% by volume and approximately 6% by volume copper sulfate, and water.

33. A process for plating a surface of a non-conductive substrate with a metal, the process comprising:

a. coating the surface with a binding solution composition, the binding solution composition comprising approximately 50% by weight of a water-born binding solution, approximately 5% by weight of carbon black powder, approximately 25% by weight of aluminum powder, and water;

b. cleaning the coated surface; and c. immersing the cleaned, coated surface into a plating bath, the plating bath comprising between approximately 5% by volume and approximately 20% by volume hydrofluoric acid, between approximately 4% by volume and approximately 6% by volume copper sulfate, and water.

34. The composition of claim 1, wherein a mixture of the binding solution, the carbon black powder, and the aluminum powder is stored in a container.

35. The composition of claim 12, wherein a mixture of the binding solution, the carbon black powder, the aluminum powder, and the water is stored in a container.

36. The composition of claim 13, wherein the composition comprises between approximately 10 grams/liter and approximately 40 grams/liter of plating metal.

37. The composition of claim 15, wherein the composition comprises between approximately 10 grams/liter and approximately 40 grams/liter of plating metal.

38. A process for plating a surface of a non-conductive substrate with a metal, the process comprising:

a. coating the surface with a binding solution composition, the binding solution composition comprising between approximately 30% by weight and approximately 70% by weight of a binding solution, between approximately 2% by weight and approximately 10% by weight of carbon black powder, between approximately 25% by weight and approximately 50% by weight of aluminum powder;

b. cleaning the coated surface; and c. immersing the cleaned, coated surface into a plating bath, the plating bath comprising copper sulfate, water, and between approximately 5% by volume and approximately 20% by volume hydrofluoric acid.

39. The composition of claim 38, wherein the plating bath comprises between approximately 40 grams/liter and approximately 160 grams/liter of copper sulfate.

40. A process for selectively plating a surface of a non-conductive substrate with a metal, the non-conductive substrate having been masked, the process comprising:

a. coating the surface with a binding solution composition, the binding solution composition comprising between approximately 30% by weight and approximately 70% by weight of a binding solution, between approximately 2% by weight and approximately 10% by weight of carbon black powder, between approximately 25% by weight and approximately 50% by weight of aluminum powder;

b. cleaning the coated surface; and c. immersing the cleaned, coated surface into a plating bath, the plating bath comprising copper sulfate, water, and between approximately 5% by volume and approximately 20% by volume hydrofluoric acid.

41. The composition of claim 40, wherein the plating bath comprises between approximately 40 grams/liter and approximately 160 grams/liter of copper sulfate.

42. A process for plating a surface of a non-conductive substrate with a metal, the process comprising:

a. coating the surface with a binding solution composition, the binding solution composition comprising approximately 50% by weight of a water-born binding solution, approximately 5% by weight of carbon black powder, approximately 25% by weight of aluminum powder, and water;

b. cleaning the coated surface; and c. immersing the cleaned, coated surface into a plating bath, the plating bath comprising copper sulfate, water, and between approximately 5% by volume and approximately 20% by volume hydrofluoric acid.

43. The composition of claim 42, wherein the plating bath comprises between approximately 40 grams/liter and approximately 160 grams/liter of copper sulfate.

* * * * *

UNITED STATES PATENT AND TRADEMARK OFFICE
CERTIFICATE OF CORRECTION

PATENT NO. : 6,776,826 B1 Page 1 of 1
APPLICATION NO. : 09/917225
DATED : August 17, 2004
INVENTOR(S) : Norman P. Trahan, Brian Keough and Gary Aruda It is certified that error appears in the above-identified patent and that said Letters Patent is hereby corrected as shown below:

On title page, item (75), Inventors
 replace "Gary Aruda, deceased late of Portsmouth, RI (US)"
 with --Gary Aruda, Portsmouth, RI (US)--.

Signed and Sealed this

Twenty-third Day of October, 2007

JON W. DUDAS
*Director of the United States Patent and Trademark Office*